(12) United States Patent
Chien et al.

(10) Patent No.: US 6,597,249 B2
(45) Date of Patent: Jul. 22, 2003

(54) FAST COARSE TUNING CONTROL FOR PLL FREQUENCY SYNTHESIZER

(75) Inventors: Hwey-Ching Chien, San Diego, CA (US); Ping An, San Diego, CA (US); Zaw M. Soe, Encinitas, CA (US)

(73) Assignee: Prominenet Communications, Inc., San Diego, CA (US)

( * ) Notice: Subject to any disclaimer, the term of this patent is extended or adjusted under 35 U.S.C. 154(b) by 0 days.

(21) Appl. No.: 09/945,215

(22) Filed: Sep. 4, 2001

(65) Prior Publication Data

US 2003/0048139 A1 Mar. 13, 2003

(51) Int. Cl.[7] .................................................. H03B 5/24
(52) U.S. Cl. .................................. 331/177 R; 327/147
(58) Field of Search ....................... 331/108 C, 108 B, 331/17, 1 R, 177 R, 25, DIG. 2, 175; 327/147, 156; 375/376

(56) References Cited

U.S. PATENT DOCUMENTS

| | | | | |
|---|---|---|---|---|
| 6,137,372 A | * | 10/2000 | Welland | 331/1 A |
| 6,215,835 B1 | * | 4/2001 | Kyles | 375/326 |
| 6,380,810 B1 | * | 4/2002 | Sutton | 331/17 |
| 6,396,358 B1 | * | 5/2002 | Poss et al. | 331/177 R |
| 2002/0036545 A1 | * | 3/2002 | Fridi et al. | 331/17 |

* cited by examiner

*Primary Examiner*—Timothy P. Callahan
*Assistant Examiner*—Linh Nguyen
(74) *Attorney, Agent, or Firm*—H. C. Lin

(57) ABSTRACT

The VCO of a synthesizer operates with a coarse tuning and a fine tuning. During the coarse tuning, a binary search method is used to match the VCO frequency to one of a finite number of discrete reference frequencies. The coarse tuning operates without frequency division and phase comparison in a closed feedback loop, thereby speeding up the settling time and increasing the lock-in range. The fine tuning operates as a conventional analog PLL.

3 Claims, 2 Drawing Sheets

FAST COARSE TUNING CONTROL FOR PLL FREQUENCY SYNTHESIZER

BACKGROUND OF THE INVENTION (1) Field of the Invention

This invention relates to frequency synthesizers, particularly to high radio frequency synthesizers. (2) Brief Description of Related Art In the field of wireless communication where a large number of channels are crowded in narrow high frequency ranges, frequency synthesizers are widely used to generate stable frequencies for transceivers either as the transmitting frequencies or the local oscillator frequencies to beat with the receiving signals. A frequency synthesizer is a phase locked loop (PLL) with a basic circuit shown in FIG. 1. The phase detector 1 generates an output signal which is function of the difference between the phases of two input frequencies. One of the frequencies is a reference frequency Fr derived from a crystal oscillator which generates a fixed stable frequency. The other frequency Fo is a derived from a voltage-controlled oscillator (VCO) 3 and divided by a frequency divider 4. The phase detector 1 output is filtered by a low-pass filter 5 and dc component of the error signal is applied to the VCO. The signal fed back to the phase detector 1 the VCO output frequency is divided by a factor of M. The VCO control voltage Vctrl forces the VCO to change frequency in the direction that reduces the difference between the reference frequency and the divided output frequency Fo. If the two frequencies are sufficiently close, the PLL feedback mechanism forces the two-phase detector input frequencies to be equal, and the VCO is "locked" with the incoming frequency.

The frequency of the VCO is usually controlled by a varactor, whose capacitance varies with applied dc voltage. A varactor is a reversed biased junction diode, which resonates with an inductor to cause oscillation. To reduce phase noise, the resonant LC circuit of the oscillator should have low series resistance (i.e. high quality factor Q). The varactor diode contributes substantially to the series resistance, since it is fabricated with semiconductor material. To reduce the series resistance, the varactor diode is preferably fabricated with highly doped, low resistivity semiconductor material. Unfortunately, low resistivity semiconductor material also reduces the tuning range of the varactor diode.

To increase the tuning range of the varactor, Welland proposed in U.S. Pat. No. 6,137,372 to use a coarse tuning arrangement in conjunction with fine tuning for the VCO. A discretely variable capacitance provides the coarse tuning adjustment, and a continuously variable capacitance (i.e. varactor) provides the fine tuning. In such a scheme, the varactor tunes the frequency over a narrower range than the overall tuning range, and allows a high Q resonant circuit to be used. While the fine tuning is obtained with an analog PLL system, the coarse tuning is achieved with quantized signal level feedback loop for digitally controlling VCO frequency in discrete steps. In the coarse tuning step, an arbitrary initial control voltage is applied to the VCO. The output frequency is divided and compared with a reference frequency to generate an error digital signal to reset the digital-control voltage of the VCO by selecting one of a number discrete capacitors in the VCO such that the divided output frequency of the VCO is closer to the reference frequency. After the coarse tuning, the operation is switched to the fine tuning mode using the final coarse frequency as initial frequency for the analog PLL to lock the VCO. The Welland coarse-fine tuning scheme has two major drawbacks: First, the initial control voltage for the VCO, which is randomly selected, is such that "the error (digital signal) may be too great" to fall outside the lock-in range of the feedback loop, then another initial voltage must be selected by cut-and try. Such a cut-and-try selection of the initial control voltage may slow down the operation. Another drawback of Welland scheme is that the coarse tuning requires dividing the VCO frequency and comparing with a reference frequency in a feedback loop. The frequency division and comparison in a closed feedback loop undesirably increase the settling time and reduces the capture range of a PLL than an open-loop.

SUMMARY OF THE INVENTION

An object of this invention is to widen the tuning range of a phase-locked loop for frequency synthesizers. Another object of this invention is to automatically coarse tune the VCO close to the final tuning range for fine tuning. Still another object of the invention is to reduce the settling time of a PLL during coarse tuning of the VCO. Still another object of this invention is to increase the capture range of a PLL during coarse tuning of the VCO. A further object of this invention is to reduce the cycling time during the coarse tuning period.

These objects are achieved by using a coarse tuning in conjunction with a fine tuning of the VCO. The coarse tuning is accomplished without frequency division and comparison in a closed feedback loop. During the coarse tuning, the initial control voltage sets the VCO to generate a frequency in the middle of the frequency range of interest. The initial VCO frequency or divided frequency is compared with a reference frequency. The difference or error frequency is used to digitally control the VCO and to select one of a number of discrete capacitors to coarse-tune the VCO close to the reference frequency. The coarse-tuning is provided by means of binary search without closing the feedback loop. The maximum frequency range is divided into n bit digital values i.e. $M=2^n$, which digitally control a number of discrete frequencies and the coarse tuning tunes the VCO to within one half of the least significant bit of the frequency. The maximum number of steps to tune within one half of the significant bit is (n−1) times. After the digitally controlled coarse tuning, the analog phase-locked loop is closed to fine tune the VCO as in a conventional synthesizer.

DETAILED DESCRIPTION OF THE INVENTION

Figure 2:
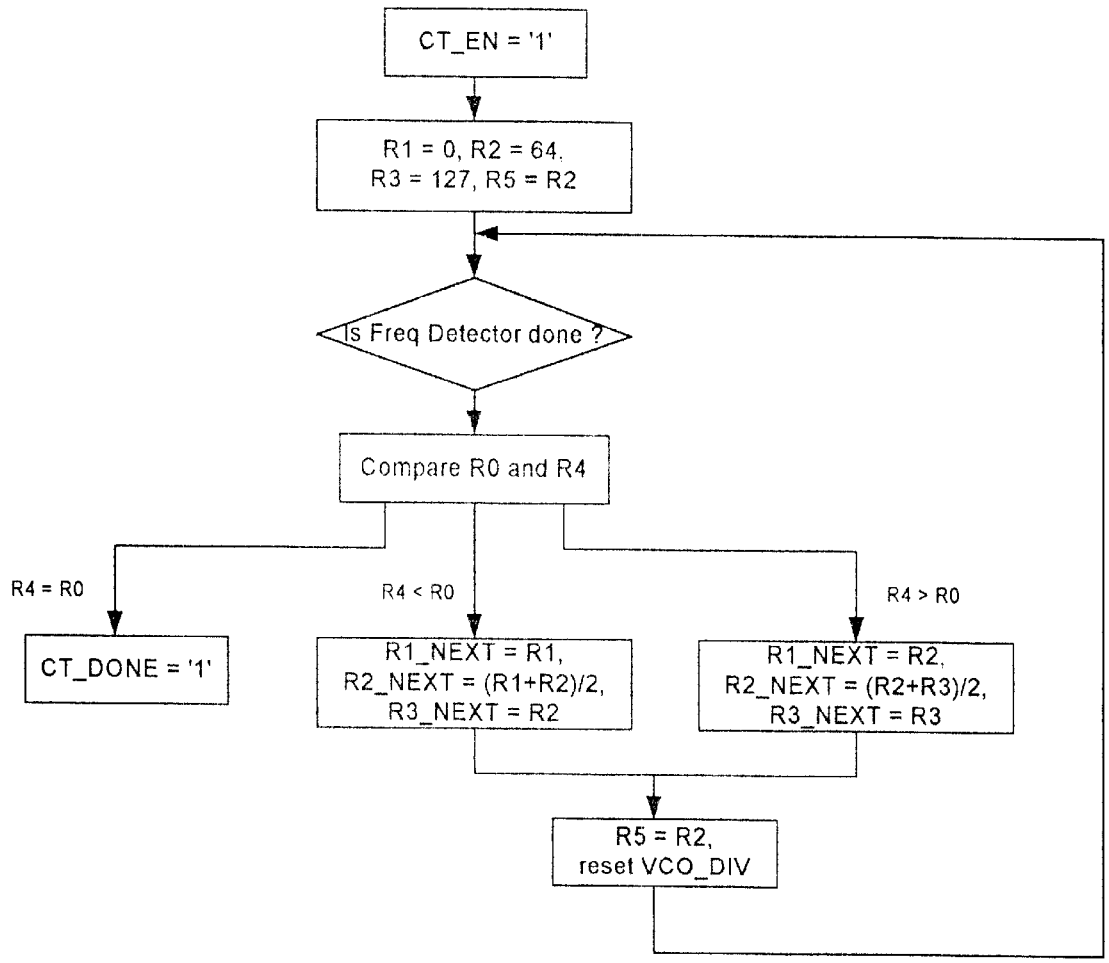
FIG. 2 shows the flow graph of binary search of the present invention.

The VCO in the frequency synthesizer of the present invention has an analog control input and a digital control input. Coarse tuning is implemented at the beginning of the operation, where the digital control input is used. During the coarse tuning, the frequency range of interest is divided into $2^n$ discrete coarse frequencies, where n is an integer. By means of binary search operation, the VCO is tuned to within one half of the least significant bit (½") value of one of the $2^n$ discrete levels. A binary search is implemented to divide the search space in two each time, and the desired data can be found in at most (n−1) steps. The coarse tuning operation applies a binary search algorithm to determine the closest digital word to match an input signal. FIG. 2 shows a flow graph for the binary search, where the symbols are defined in the description of FIG. 4.

Figure 1:
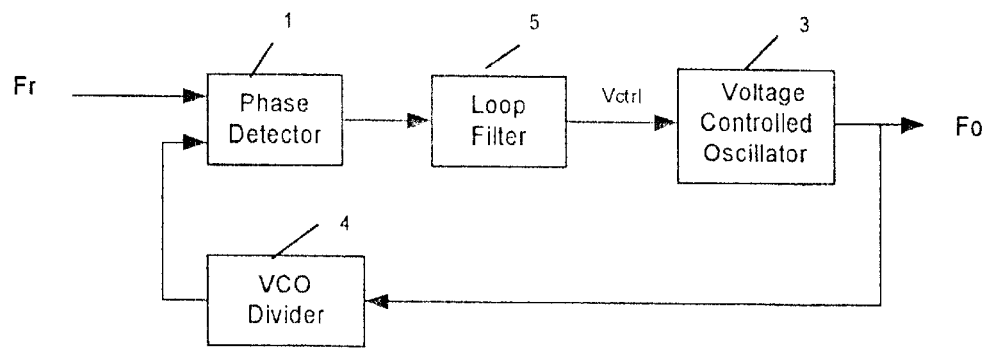
FIG. 1 shows the basic block diagram of a phase-locked loop (PLL) of a frequency synthesizer
Figure 3:
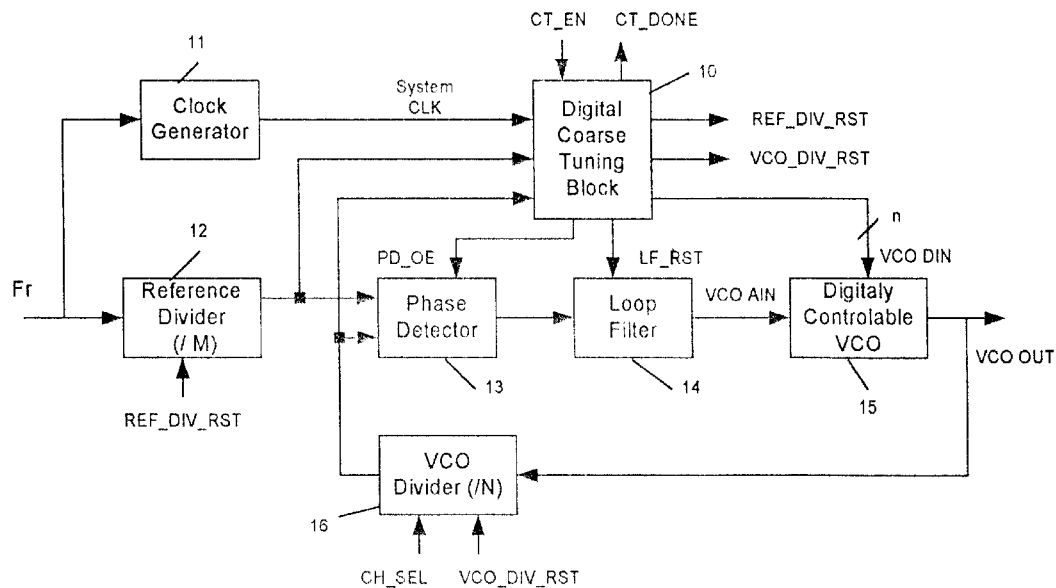
FIG. 3 shows block diagram of the tuning system based on the present invention.

After the coarse tuning, the operation is switched into analog fine tuning as in conventional PLL shown in FIG. 3, using the final discrete frequency during coarse tuning as initial frequency for the analog PLL. The coarse tuning is handled by the Digital Coarse Tuning Block 10, which is deactivated during the fine tuning. During fine tuning, the reference frequency fr, usually from a crystal oscillator, is divided by the Reference Divider (/M) 12, which is reset by a control signal REF__DIV__RST. The divided frequency is fed to a Phase Detector 13, which is enabled by a signal PD__OE. The output of the phase detector 13 is filtered by a low-pass Loop Filter 14, which is reset by a signal LF__RST. The analog out put VCO__AIN from the loop filter 14 is used to control the VCO 15. The output frequency of the VCO 15 is divided by the frequency Divider (/M) 16. The division is programmed by the channel select signal CH__SEL and reset by the signal VCO__DIV__RST. The divided frequency is compared with the frequency of the Reference Divider 12 to form a phase-locked loop. The fine analog control coming from PLL loop filter tunes VCO output frequency as shown in FIG. 1 as is well-known in the art.

Figure 4:
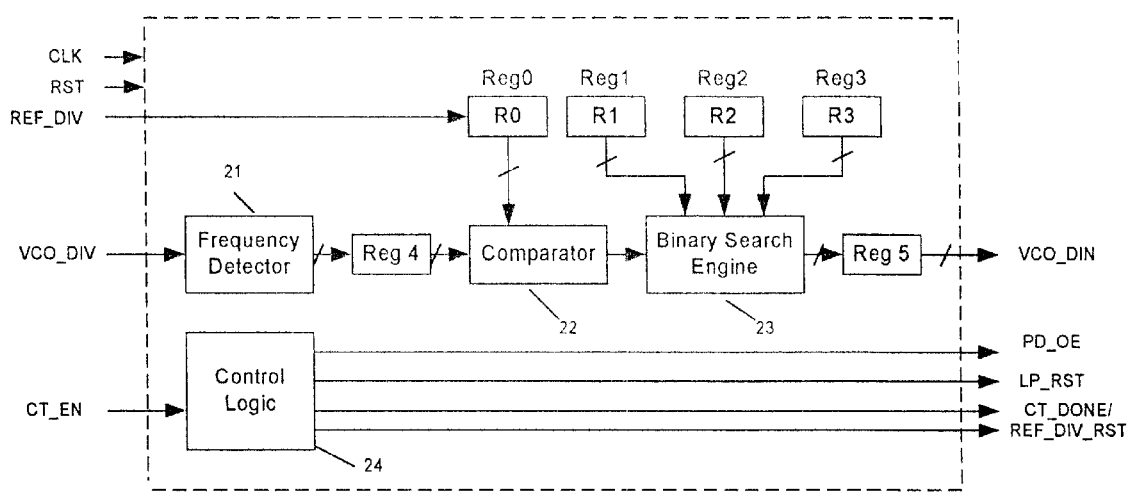
FIG. 4 shows the block diagram of the digital coarse tuning block.

The operation of the coarse tuning is handled by the Digital Coarse Tuning Block 10 as shown in FIG. 4. The block has a Frequency Detector 21 which counts the number of clock cycles in one VCO-DIV period, which is a constant. The count is stored in register R4 and compared in comparator 22 with the number of clock cycles in one VCO-DIV period stored in register R0. The output of the comparator 22 period is fed a Binary Search Engine 23, which implements the binary search algorithm and updates three registers R1, R2, R3. The result of the binary search is stored in register Reg 5 with value R5, which is used to digitally control the discrete frequencies of the VCO 15. The Digital Coarse Tuning Block 10 also contains a Control Logic block 24, which is enabled by a signal CT__EN and sends out control signals PD__OE to disable the Phase Detector 13, LP__RST to reset the Loop Filter 14, CT__DONE to signal the end of coarse tuning, REF__DIV__RST to reset the Reference Divider 12 after coarse tuning is done, and VCO__DIV__RST to reset the VCO Divider 16 after one cycle of binary search or after coarse tuning is finished.

As an example, the coarse tuning tunes the VCO to 0.1% resolution. In order to achieve 0.1% coarse tuning resolution, a high enough frequency as system clock CLK for coarse tuning block 10 is used. When a new channel is selected, the system sets the VCO divider 16 to have $2^n$ discrete frequencies. Before coarse tuning starts, digital input VCO__DIN of the VCO 15 is set at a value in the mid frequency of tuning range which is 2 to the power of (n−1), and the phase detector output is disabled throughout the entire coarse tuning state. The system sets the coarse tuning enable CT__EN to '1'. The coarse tuning logic starts to coarse tune VCO to the nearest frequency it can reach within one quarter of the frequency coarse tuning range in the first cycle. Then the VCO__DIN signal is reset to 2 to the power of (n−1) again and the cycle repeats to coarse tune the VCO to the nearest frequency within one eighth of coarse tuning range in the second cycle. The cycle repeats until the VCO is coarse tuned to one of $2^n$ discrete frequencies whose difference from the desired frequency is within the coarse tuning resolution. Then the coarse tuning is complete.

During the each cycle, the coarse tuning is accomplished without closing a phase-locked loop using a phase detector, a frequency divider and a loop filter as shown in FIG. 4. Before the coarse tuning starts, the registers R1, R2, R3 of the binary search engine, which is a binary search registers BSR, are initialized to the following number: R1=0, R2=L/2, R3=(L−1) where L $2^n$ and n is the number of VCO digital input bits. When the coarse tuning starts, coarse tuning enable CT__EN goes high. The frequency detector starts to count the number of the system clock cycles within one VCO divider output cycle. This value is stored in register R4. Once counting is complete, the frequency detector compares this value with the reference number stored in register R0 which is the number of system clock cycles within one reference divider output cycle. The result of the comparison could be one of the three: fast, slow or equal. The binary search-engine BSR, then uses the comparison result to update the register R1, R2, R3 based on the following binary search algorithm shown in FIG. 2 as follows:

If VCO is faster than reference
    R1__NEXT=R1;
    R2__NEXT=(R1+R2)/2;
    R3__NEXT=R2;
Else If VCO is slower than reference
    R1__NEXT=R2;
    R2__NEXT=(R2+R3)/2;
    R3__NEXT=R3;
Else
    CT__DONE='1';

For example, if n=7, then L=128, R1=0, R2=64, R3=127. If VCO is faster than the reference, R1=0, R2=32, R3=64. If VCO is slower than the reference, R1=64, R2=96, R3=127. If VCO is equal to the reference, R1=0, R2=64, R3=127. In other words, if VCO is faster, R2 lies midway in the range between 0 and 64; if VCO is slower, R2 lies midway between 64 and 127; and if VCO is equal to reference, R2 remains at 64. The registers R1, R2 and R3 update the initial count for the counter in the Binary Search Engine BSR. Every time R1~R3 are updated, R5 is also loaded with the value Reg2 (i.e. 32, 64 or 96) to yield a digital control signal VCO__DIN for the VCO, thereby selecting the appropriate discrete capacitor in the VCO for coarse tuning. Immediately after the binary search is finished, the VCO divider is reset to begin frequency detection again. In this manner, the coarse tuning time is reduced by half Once the coarse tuning is done, R1~R3 will be reset to initial numbers again to be ready for the next coarse tuning cycle. VCO__DIN is fixed at the coarsely tuned number and PLL starts to fine-tune VCO with analog control signal VCO__AIN. Also once the coarse tuning is done, VCO divider and reference divider can be both reset to force the phase alignment to speed up the PLL fine-tuning. The maximum coarse tuning time is (n−1) VCO divider cycles. The minimum time could be one VCO divider cycle. The coarse tuning block diagram is shown in FIG. 4.

The following example illustrates the operation: Let

Incoming signal frequency range=1749.62±30 MHz= 1719.62 to 1779.62 MHz

Channel spacing=50 KHz (in CDMA system, REF__DIV=10 KHz, channel spacing is 50 KHz)

Reference frequency fr=19.68 MHz

System clock CLk=9.84 MHz (in this example we use ½ of fr as the system clock) n=7; $2^n$=128 (in this example, the VCO coarse tuning range is about 64 MHz, i.e., the resolution of VCO coarse tuning is 64 MHz/128=500 KHz, VCO center frequency is 1750.26 MHz)

Number of discrete CDMA frequencies: $f_0$=1719.62 MHz, $f_1$=1719.62+0.05×1=1719.67 MHz, . . . $f_{1200}$= 1719.62+0.05×1200=1779.62 MHz Frequency to be tuned to: 1779.62 MHz VCO Divider ratio N=177962

Initial setting: VCO_DIN=64; CT_EN="1"; VCO_AIN=0; PLL fine tune: disabled.

The values of the different registers, VCO_DIN and VCO_OUT for four coarse tuning cycles are tabulated in the following table:

| Cycle | R0 | R4 | R1 | R2 | R3 | R5 | VCO_DIN | VCO_OUT (kHZ) |
|---|---|---|---|---|---|---|---|---|
| 1 | 984 | 1001 | 0 | 64 | 127 | 64 | 64 | 1750263.872 |
| 2 | 984 | 992 | 64 | 95 | 127 | 95 | 95 | 1765954.652 |
| 3 | 984 | 987 | 95 | 111 | 127 | 111 | 111 | 1774053.089 |
| 4 | 984 | 984 | 111 | 119 | 127 | 119 | 119 | 1778102.318 |

After four cycles, the coarse tuning is finished because the two inputs of the comparator VCO_OUT 1778102.318 is within 1517 kHz of the desired frequency of 1779.62 MHz. Thereafter the VCO is switched to analog fine tuning using a PLL.

Other simulation results of tuning are shown in the following table: Simulation parameters:

Channel frequency f=1749.6±30 MHz 1719600 to 1779600 KHz

Channel spacing=500 KHz

VCO divider ratio=17196, 17201, . . . , 17796 with spacing 5

Reference XTL frequency=196.8 MHz

REF_DIV=100 KHz

TABLE 1

The simulation results of coarse tuning

| Divider Ratio, N | VCO_DIN | VCO_DIV cycles | VCO_OUT (kHz) | Target channel | E% |
|---|---|---|---|---|---|
| 17196 | 2 | 6 | 1,718,916 | 1,719,600 | 0.04 |
| 17396 | 40 | 4 | 1,738,110 | 1,739,600 | −0.09 |
| 17496 | 60 | 5 | 1,748,221 | 1,749,600 | −0.08 |
| 17646 | 91 | 5 | 1,763,931 | 1,764,600 | −0.04 |
| 17796 | 119 | 4 | 1,778,106 | 1,779,600 | −0.08 |

Once coarse tuning is finished, the digital input DIN of the VCO is fixed at the tuned value, and the PLL and phase detector 13 are turned on to fine-tune the VCO until it is phase-locked. This cycle restarts when another new channel is selected by the system.

While the preferred embodiments of the invention have been described, it will be apparent to those skilled in the art that various modifications may be made in the embodiments without departing from the spirit of the present invention. Such modifications are all within the scope of this invention.

What is claimed is:

1. A frequency synthesizer to lock the frequency of a voltage controlled oscillator (VCO) with a reference frequency, comprising
    a coarse tuning mechanism to match the VCO frequency to within a frequency tolerance of a number of discrete reference frequencies by means of digitally controlled binary search; and
    a fine tuning mechanism to lock the VCO frequency by means of an analog phase-locked loop, using the final discrete frequency of said discrete reference frequencies in coarse tuning as the initial frequency for the analog PLL,
    wherein the number of the discrete reference frequencies is equal to $2^n$ over the frequency range of the VCO, and the frequency tolerance is equal one half of $½^n$ of the frequency range of the VCO, where n is an integer.

2. The frequency synthesizer as described in claim 1, wherein the binary search may require more than one cycle of operation to reach the final coarse tuning frequency, and the coarse tuning mechanism comprises:
    a frequency detector to digitally count the number of frequency of the VCO within a time frame;
    a first register R0 to store digitally the reference frequency count within said time frame;
    a digital comparator R4 to compare the frequency count of the frequency detector and the reference frequency count;
    a first register R1, second register R2 and a third register R3 connected to a successive approximation register and updated by the output of the comparator;
    a digital output register R5 to store the output of the successive approximation register for digitally controlling the frequency of the VCO closer to the reference frequency; and
    a control logic to stop the coarse tuning, to reset the low pass filter during said fine tuning, to reset the frequency divider of the reference frequency, and to disable the phase detector of the phase-locked loop during said fine tuning.

3. The frequency synthesizer as described in claim 2, wherein each cycle of the coarse tuning mechanism operates as an open loop and R1, R2 and R3 are updated in each cycle of the binary search, following the algorithm:

If VCO is faster then the reference frequency:
    R1_NEXT=R1;
    R2_NEXT=(R1+R2)/2
    R3_NEXT=R2;
Else IF VCO is slower than reference
    R1_NEXT=R2;
    R2_NEXT=(R2+R3)/2;
    R3_NEXT=R3;
Else
    CT_DONE←'1'.

* * * * *